(12) United States Patent
Byeon

(10) Patent No.: US 8,760,199 B2
(45) Date of Patent: Jun. 24, 2014

(54) BUFFER CIRCUIT

(75) Inventor: Sang-Yeon Byeon, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 0 days.

(21) Appl. No.: 13/446,397

(22) Filed: Apr. 13, 2012

(65) Prior Publication Data

US 2013/0147558 A1 Jun. 13, 2013

(30) Foreign Application Priority Data

Dec. 12, 2011 (KR) .......................... 10-2011-0133166

(51) Int. Cl.
*H03B 1/00* (2006.01)
*H03K 19/003* (2006.01)
(52) U.S. Cl.
CPC ................................ *H03K 19/00361* (2013.01)
USPC ......................................................... 327/108

(58) Field of Classification Search
USPC .......................... 327/108–112, 170, 389, 391; 326/22–27, 82, 83; 365/230.06
See application file for complete search history.

(56) References Cited

U.S. PATENT DOCUMENTS 6,046,624 A * 4/2000 Nam et al. .................... 327/530

FOREIGN PATENT DOCUMENTS

| KR | 1020070021560 | 2/2007 |
| KR | 1020100131103 | 12/2010 |

* cited by examiner

*Primary Examiner* — Sibin Chen
(74) *Attorney, Agent, or Firm* — IP & T Group LLP

(57) ABSTRACT

A buffer circuit includes an amplification unit configured to amplify and output a difference between an input signal and a reference voltage; and a driver configured to drive an output node in response to the output of the amplification unit and be controlled in at least one of a pull-up driving strength and a pull-down driving strength at the output node in response to the reference voltage.

11 Claims, 5 Drawing Sheets

BUFFER CIRCUIT

CROSS-REFERENCE TO RELATED APPLICATIONS

The present application claims priority of Korean Patent Application No. 10-2011-0133166, filed on Dec. 12, 2011, which is incorporated herein by reference in its entirety.

BACKGROUND

1. Field

Exemplary embodiments of the present invention relate to a buffer circuit that senses and amplifies an input signal and drives the amplified signal.

2. Description of the Related Art

A buffer circuit adopted as an interface circuit in a semiconductor device such as a semiconductor memory plays an important role of receiving and buffering a signal applied from outside and transferring the buffered signal to an internal circuit of a chip.

FIG. 1 is a diagram showing a conventional buffer circuit.

Referring to FIG. 1, the buffer circuit includes an amplification unit 10 which amplifies an input signal IN and a driver 20 which pull-up drives or pull-down drives an output node in response to an amplified signal PRE_OUT. The driver 20 may be constituted by an inverter. The amplification unit 10 amplifies the difference between the input signal IN and a reference voltage VREF and outputs the amplified difference as the amplified signal PRE_OUT to the driver 20. The driver 20 inverts the amplified signal PRE_OUT and outputs a resultant signal to an internal circuit of a chip.

If an offset occurs in the reference voltage VREF, the duty of the signal PRE_OUT outputted from the amplification unit 10 may become unbalanced. That is to say, the high pulse width and the low pulse width of the output signal PRE_OUT of the amplification unit 10 may become different from each other. This will be described below with reference to FIG. 2.

FIG. 2 is a waveform diagram of the buffer circuit shown in FIG. 1.

FIG. 2 exemplifies that the reference voltage VREF is increased by a positive (+) offset OFFSET. Although the ratio between the high pulse width and the low pulse width of the input signal IN have been balanced to be 1:1, as the positive (+) offset OFFSET occurs in the reference voltage VREF, the high pulse width of the output signal PRE_OUT of the amplification unit 10 decreases, and the low pulse width of the output signal PRE_OUT of the amplification unit 10 increases. In other words, the duty of the output signal PRE_OUT of the amplification unit 10 becomes unbalanced. As the output signal PRE_OUT is inverted by the driver 20, in a signal OUT loaded on the output node, the high pulse width becomes longer than the low pulse width. Namely, the duty of the signal OUT loaded on the output node becomes unbalanced as well.

In this way, in the conventional buffer circuit, if the offset OFFSET occurs in the reference voltage VREF inputted to the amplification unit 10, the duty of the signal OUT loaded on the output node becomes unbalanced. If the duty of the signal OUT becomes unbalanced, the integrity of the signal OUT may deteriorate and data may be recognized incorrectly.

SUMMARY

An embodiment of the present invention is directed to a buffer circuit which can buffer a signal while constantly maintaining the duty of the signal even though an offset occurs in a reference voltage.

In accordance with an embodiment of the present invention, a buffer circuit includes: an amplification unit configured to amplify a difference between an input signal and a reference voltage and output the amplified difference as an output of the amplification unit; and a driver configured to drive an output node in response to the output of the amplification unit and be controlled in at least one of a pull-up driving strength and a pull-down driving strength at the output node in response to the reference voltage.

In accordance with another embodiment of the present invention, a buffer circuit includes: an amplification unit configured to amplify a difference between an input signal and a reference voltage and output the amplified difference as an output of the amplification unit; a driving unit configured to pull-up drive or pull-down drive an output node in response to the output of the amplification unit; and a driving strength control unit configured to control at least one of a pull-up driving strength and a pull-down driving strength of the driving unit at the output node in response to the reference voltage.

DETAILED DESCRIPTION

Figure 1:
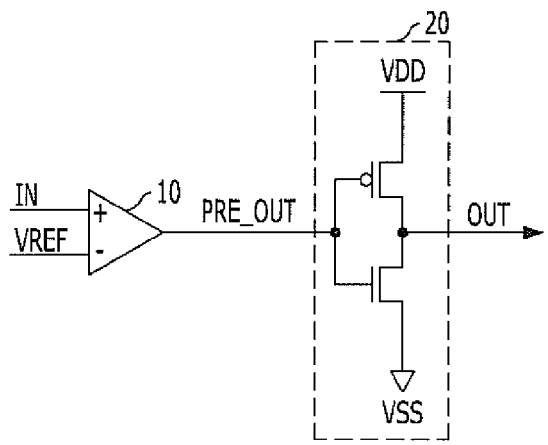
FIG. 1 is a diagram showing a conventional buffer circuit.
Figure 2:
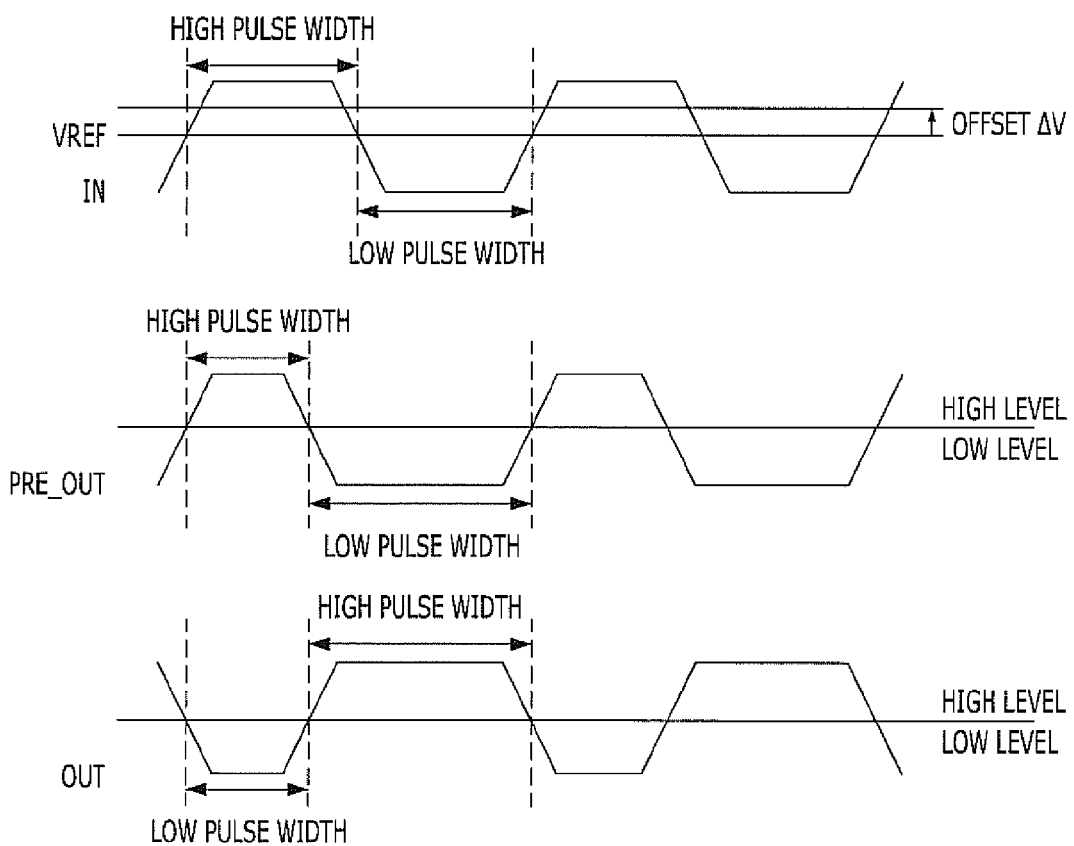
FIG. 2 is a waveform diagram of the buffer circuit shown in FIG. 1.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
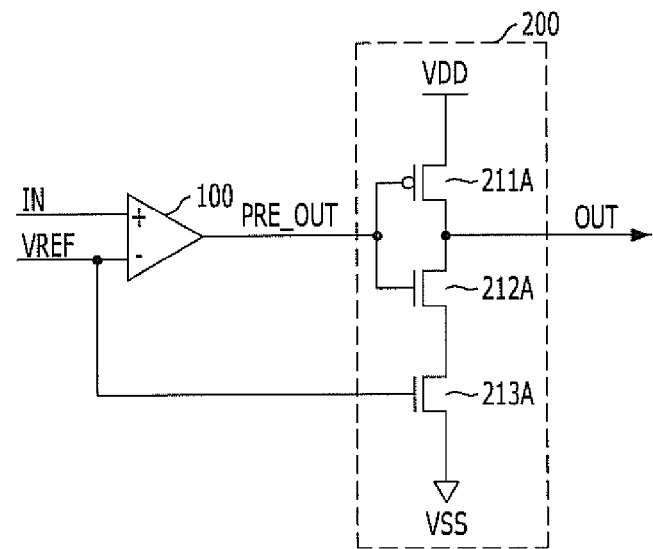
FIG. 3 is a diagram showing a buffer circuit in accordance with an embodiment of the present invention.

FIG. 3 is a diagram showing a buffer circuit in accordance with an embodiment of the present invention.

Referring to FIG. 3, a buffer circuit may include an amplification unit 100 and a driver 200.

The amplification unit 100 is configured to amplify a difference between an input signal IN and a reference voltage VREF and output a resultant amplified signal to the driver 200. The amplification unit 100 may be constituted by an OP-AMP (operational amplifier).

The driver 200 is configured to pull-up drive or pull-down drive an output node in response to an output signal PRE_OUT of the amplification unit 100 and in response to the reference voltage VREF. In a first embodiment of the driver 200 shown in FIG. 3, if the level of the reference voltage VREF rises, a pull-down driving force increases, and if the level of the reference voltage VREF falls, a pull-down driving force decreases. In detail, the driver 200 may include a first transistor 211A, a second transistor 212A, and a third transistor 213A.

The first transistor 211A pull-up drives the output node in response to the output signal PRE_OUT of the amplification unit 100. In detail, the first transistor 211A may be a PMOS transistor and has a gate terminal to which the output signal PRE_OUT of the amplification unit 100 is applied, a source terminal connected with a high level voltage, for example, a power supply voltage VDD, and a drain terminal connected with the drain terminal of the second transistor 212A. If the level of the output signal PRE_OUT of the amplification unit 100 is a low level, the first transistor 211A is turned on, and thus, the power supply voltage VDD is supplied to the output node. That is, the output node is pull-up driven. A degree to which the first transistor 211A is turned on is changed depending upon the voltage magnitude of the output signal PRE_OUT inputted to the gate terminal, and accordingly, an amount of current flowing through the first transistor 211A to the output node is changed. In other words, the strength of the pull-up driving force varies depending upon the voltage level of the signal PRE_OUT applied to the gate terminal of the first transistor 211A. In detail, as the voltage level of the signal PRE_OUT applied to the gate terminal becomes lower, the first transistor 211 is turned on stronger, where as the first transistor 211A is turned on stronger, the amount of current flowing through the first transistor 211A to the output node increases. Conversely, as the voltage level of the signal PRE_OUT applied to the gate terminal of the first transistor 211A becomes higher, the first transistor 211A is turned on weaker, where as the first transistor 211A is turned on weaker, the amount of current flowing through the first transistor 211A to the output node decreases.

The second transistor 212A pull-down drives the output node in response to the output signal PRE_OUT of the amplification unit 100. In detail, the second transistor 212A may be an NMOS transistor, and has a gate terminal to which the output signal PRE_OUT of the amplification unit 100 is applied, a drain terminal connected with the drain terminal of the first transistor 211A and a source terminal connected with the drain terminal of the third transistor 213A. If the output signal PRE_OUT of the amplification unit 100 is at a high level, the second transistor 212A is turned on, and thus, a ground voltage VSS and the output node are connected with each other. That is, the output node is pull-down driven. A degree to which the second transistor 212A is turned on is changed depending upon the voltage magnitude of the output signal PRE_OUT inputted to the gate terminal, and thus, an amount of current flowing through the second transistor 212A is changed. In other words, the strength of the pull-down driving force varies depending upon the voltage level of the signal PRE_OUT applied to the gate terminal of the second transistor 212A. In detail, as the voltage level of the signal PRE_OUT applied to the gate terminal becomes higher, the second transistor 212A is turned on stronger, and thus, the amount of current flowing from the output node to the source terminal of the second transistor 212A increases. Conversely, as the voltage level of the signal PRE_OUT applied to the gate terminal of the second transistor 212A becomes lower, the turn-on degree of the second transistor 212A decreases, and thus, the amount of current flowing from the output node to the source terminal of the second transistor 212A decreases.

The third transistor 213A controls the pull-down driving force of the driver 200 in response to the reference voltage VREF. The third transistor 213A increases the pull-down driving force of the driver 200 when a positive (+) offset occurs in the reference voltage VREF and decreases the pull-down driving force of the driver 200 when a negative (−) offset occurs in the reference voltage VREF. In detail, the third transistor 213A may be an NMOS transistor and has a gate terminal to which the reference voltage VREF is applied, a source terminal connected with a low level voltage, for example, the ground voltage VSS, and the drain terminal connected with the source terminal of the second transistor 212A.

Operations of the driver 200 will be described below.

For example, the level of the reference voltage VREF may change from an alpha level to a beta level (alpha level<beta level). In such a case, the turn-on degree of the third transistor 213A increases compared to when the reference voltage VREF of the alpha level is applied to the gate terminal. Thus, the amount of current flowing from the output node to the source terminal of the third transistor 213A increases compared to when the reference voltage VREF of the alpha level is applied to the gate terminal. Here, the pull-down driving force of the driver 200 is increased. The level of a signal OUT loaded on the output node is determined by the relative strengths of the pull-up driving force and the pull-down driving force. More specifically, in the case where the strength of the pull-up driving force is larger than the strength of the pull-down driving force, the output node is pull-up driven. Thus, the signal OUT loaded on the output node becomes a high level. Conversely, in the case where the strength of the pull-down driving force is larger than the strength of the pull-up driving force, the output node is pull-down driven. Namely, the signal OUT loaded on the output node becomes a low level. For example, in the case where the reference voltage VREF of the alpha level is applied to the gate terminal of the third transistor 213A, the output node is pull-up driven if the voltage level of the output signal PRE_OUT of the amplification unit 100 is lower than a delta level, and is pull-down driven if the voltage level of the output signal PRE_OUT of the amplification unit 100 is higher than the delta level. However, in the case where the reference voltage VREF of the beta level is applied to the gate terminal of the third transistor 213A, the output node is pull-up driven if the voltage level of the output signal PRE_OUT of the amplification unit 100 is lower than a zeta level (zeta level<delta level) and is pull-down driven if the voltage level of the output signal PRE_OUT of the amplification unit 100 is higher than the zeta level. As a consequence, compared to the case where the reference voltage VREF of the alpha level is applied to the gate terminal of the third transistor 213A, if the reference voltage VREF of the beta level is applied to the gate terminal of the third transistor 213A, the high pulse width of the signal OUT loaded on the output node is shortened, and the low pulse width of the signal OUT loaded on the output node is lengthened. As a result, even though the high pulse width of the output signal PRE_OUT of the amplification unit 100 becomes shorter than the low pulse width of the output signal PRE_OUT of the amplification unit 100 due to a positive (+) offset in the reference voltage VREF, the pull-down driving force of the driver 200 is increased in correspondence to the positive (+) offset of the reference voltage VREF, so that the high pulse width and the low pulse width of the signal OUT loaded on the output node become equal to each other.

In the case where a negative (−) offset occurs in the reference voltage VREF, operations opposite to the above-described operations are performed. For example, the level of the reference voltage VREF may be changed from the alpha level to a gamma level (gamma level<alpha level). In such a case, the turn-on degree of the third transistor 213A decreases compared to when the reference voltage VREF of the alpha level is applied to the gate terminal. Thus, the amount of current flowing from the output node to the source terminal of the third transistor 213A decreases compared to when the reference voltage VREF of the alpha level is applied to the gate terminal. In other words, the pull-down driving force of the driver 200 decreases. As a consequence, compared to the case where the reference voltage VREF of the alpha level is applied to the gate terminal of the third transistor 213A, if the reference voltage VREF of the gamma level is applied to the gate terminal of the third transistor 213A, the high pulse width of the signal OUT loaded on the output node is lengthened, and the low pulse width of the signal OUT loaded on the output node is shortened. As a result, even though the high pulse width of the output signal PRE_OUT of the amplification unit 100 becomes longer than the low pulse width of the output signal PRE_OUT of the amplification unit 100 due to the negative (−) offset in the reference voltage VREF, the pull-down driving force of the driver 200 is decreased in correspondence to the negative (−) offset of the reference voltage VREF, so that the high pulse width and the low pulse width of the signal OUT loaded on the output node become equal to each other.

Hence, as the pull-down driving force is controlled through the third transistor 213A in response to the reference voltage VREF, the high pulse width and the low pulse width of the signal OUT loaded on the output node are controlled.

Figure 4:
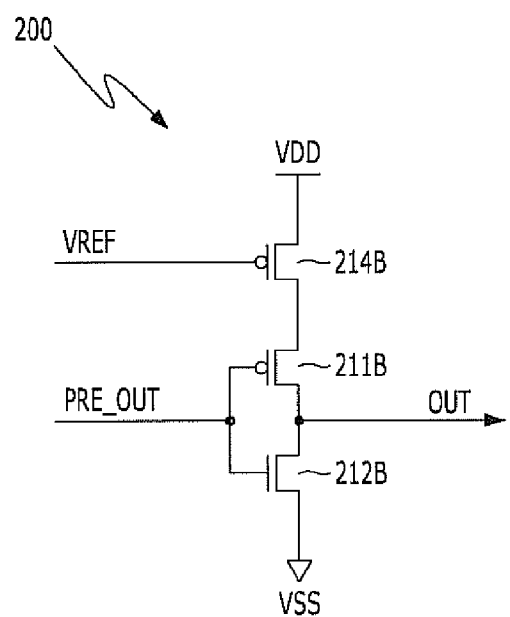
FIG. 4 is a diagram showing a driver in accordance with a second embodiment of the present invention.

FIG. 4 is a diagram showing a driver 200 in accordance with a second embodiment of the present invention.

Referring to FIG. 4, the driver 200 may include a first transistor 211B, a second transistor 212B, and a fourth transistor 214B.

The driver 200 shown in FIG. 4 is distinguished from the driver 200 shown in FIG. 3 in that a pull-up driving force decreases when the level of the reference voltage VREF rises and is increased when the level of the reference voltage VREF falls. Hereinbelow, descriptions will be mainly concentrated on differences between the driver 200 shown in FIG. 4 and the driver 200 shown in FIG. 3.

The first transistor 211B pull-up drives an output node in response to the output signal PRE_OUT of the amplification unit 100. In detail, the first transistor 211B may be a PMOS transistor having a gate terminal to which the output signal PRE_OUT of the amplification unit 100 is applied, a drain terminal connected with the drain terminal of the second transistor 212B and a source terminal connected with the drain terminal of the fourth transistor 214B.

The second transistor 212B pull-down drives the output node in response to the output signal PRE_OUT of the amplification unit 100. In detail, the second transistor 212B may be an NMOS transistor, and has a gate terminal to which the output signal PRE_OUT of the amplification unit 100 is applied, the drain terminal connected with the drain terminal of the first transistor 211B and a source terminal connected with a low level voltage, for example, a ground voltage VSS.

The fourth transistor 214B controls the pull-up driving force of the driver 200 in response to the reference voltage VREF. In detail, the fourth transistor 214B may be a PMOS transistor having a gate terminal to which the reference voltage VREF is applied, a source terminal connected with a high level voltage, for example, a power supply voltage VDD, and the drain terminal connected with the source terminal of the first transistor 211B.

Operations of the driver 200 shown in FIG. 4 will be described below. For example, the level of the reference voltage VREF may be changed from an alpha level to a beta level (alpha level<beta level). In such a case, if the level of the reference voltage VREF applied to the gate terminal of the fourth transistor 214B is changed from the alpha level to the beta level, the turn-on degree of the fourth transistor 214B decreases, as a result of which an amount of current flowing through the fourth transistor 214B to the output node decreases. In other words, the pull-up driving force of the driver 200 decreases. As a consequence, compared to the case where the reference voltage VREF of the alpha level is applied to the gate terminal of the fourth transistor 214B, if the reference voltage VREF of the beta level is applied to the gate terminal of the fourth transistor 214B, the high pulse width of a signal OUT loaded on the output node tends to be shortened, and the low pulse width of the signal OUT loaded on the output node tends to be lengthened. In detail, in the case where the reference voltage VREF of the alpha level is applied to the gate terminal of the fourth transistor 214B, the output node is pull-up driven when the level of the output signal PRE_OUT of the amplification unit 100 is lower than a delta level and is pull-down driven when the level of the output signal PRE_OUT of the amplification unit 100 is higher than the delta level. However, in the case where the reference voltage VREF of the beta level is applied to the gate terminal of the fourth transistor 214B, the output node is pull-up driven when the level of the output signal PRE_OUT of the amplification unit 100 is lower than a zeta level (zeta level<delta level) and is pull-down driven when the level of the output signal PRE_OUT of the amplification unit 100 is higher than the zeta level. As a result, even though the high pulse width of the output signal PRE_OUT of the amplification unit 100 tends to become shorter than the low pulse width of the output signal PRE_OUT of the amplification unit 100 due to a positive (+) offset in the reference voltage VREF, the pull-up driving force of the driver 200 is decreased in correspondence to the positive (+) offset of the reference voltage VREF, so that the high pulse width and the low pulse width of the signal OUT loaded on the output node become equal to each other.

In the case where a negative (−) offset occurs in the reference voltage VREF, operations opposite to the above-described operations are performed. For example, the level of the reference voltage VREF may be changed from the alpha level to a gamma level (gamma level<alpha level). If the reference voltage VREF applied to the gate terminal of the fourth transistor 214B is changed from the alpha level to the gamma level, the turn-on degree of the fourth transistor 214B increases compared to when the reference voltage VREF of the alpha level is applied to the gate terminal. Thus, the amount of current flowing from the power supply voltage VDD through the fourth transistor 214B to the output node increases compared to when the reference voltage VREF of the alpha level is applied to the gate terminal. In other words, the pull-up driving force of the driver 200 increases. As a consequence, compared to the case where the reference voltage VREF of the alpha level is applied to the gate terminal of the fourth transistor 214B, if the reference voltage VREF of the gamma level is applied to the gate terminal of the fourth transistor 214B, the high pulse width of the signal OUT loaded on the output node tends to lengthen, and the low pulse width of the signal OUT loaded on the output node tends to shorten. As a result, even though the high pulse width of the output signal PRE_OUT of the amplification unit 100 tends to become longer than the low pulse width of the output signal PRE_OUT of the amplification unit 100 due to the negative (−) offset in the reference voltage VREF, the pull-up driving force of the driver 200 is increased in correspondence to the negative (−) offset of the reference voltage VREF, and the high pulse width and the low pulse width of the signal OUT loaded on the output node become equal to each other.

Figure 5:
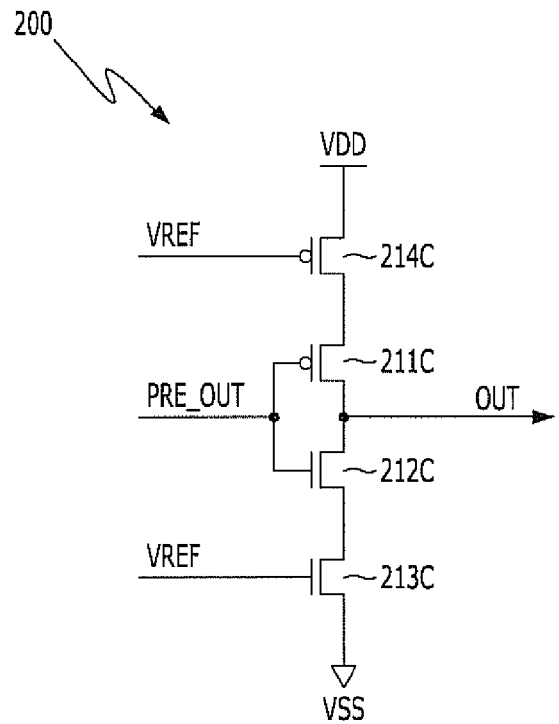
FIG. 5 is a diagram showing a driver in accordance with a third embodiment of the present invention.

FIG. 5 is a diagram showing a driver 200 in accordance with a third embodiment of the present invention.

Referring to FIG. 5, the driver 200 may include a first transistor 211C, a second transistor 212C, a third transistor 213C, and a fourth transistor 214C.

The driver 200 shown in FIG. 5 is distinguished from the drivers 200 shown in FIGS. 3 and 4 in that a pull-up driving force and a pull-down driving force are both controlled in response to the reference voltage VREF. That is to say, in the driver 200 shown in FIG. 5, the pull-up driving force decreases and the pull-down driving force increases when the level of the reference voltage VREF rises, and the pull-up driving force increases and the pull-down driving force decreases when the level of the reference voltage VREF falls. Hereinbelow, descriptions will be mainly concentrated on differences between the driver 200 shown in FIG. 5 and the drivers 200 shown in FIGS. 3 and 4.

The first transistor 211C and the fourth transistor 214C shown in FIG. 5 have the same configurations and operating principles as the first transistor 211B and the fourth transistor 214B shown in FIG. 4. Also, the second transistor 212C and the third transistor 213C shown in FIG. 5 have the same configurations and operating principles as the second transistor 212A and the third transistor 213A shown in FIG. 3.

If the reference voltage VREF is changed from an alpha level to a beta level (alpha level<beta level), that is, if the level of the reference voltage VREF applied to the gate terminal of the third transistor 213C is changed from the alpha level to the beta level, the turn-on degree of the third transistor 213C increases compared to when the reference voltage VREF of the alpha level is applied to the gate terminal of the third transistor 213C. In other words, the pull-down driving force of the driver 200 is increased. Further, if the level of the reference voltage VREF applied to the gate terminal of the fourth transistor 214C is changed from the alpha level to the beta level, the turn-on degree of the fourth transistor 214C decreases compared to when the reference voltage VREF of the alpha level is applied to the gate terminal of the fourth transistor 214C. In other words, the pull-up driving force of the driver 200 is decreased. As a consequence, compared to the case where the level of the reference voltage VREF is the alpha level, if the level of the reference voltage VREF is the beta level, the high pulse width of a signal OUT loaded on the output node tends to shorten, and the low pulse width of the signal OUT loaded on the output node tends to lengthen. As a result, even though the high pulse width of the output signal PRE_OUT of the amplification unit 100 becomes shorter than the low pulse width of the output signal PRE_OUT of the amplification unit 100 due to a positive (+) offset in the reference voltage VREF, the pull-up driving force of the driver 200 is decreased and the pull-down driving force of the driver 200 is increased in correspondence to the positive (+) offset of the reference voltage VREF, so that the high pulse width and the low pulse width of the signal OUT loaded on the output node are controlled to become equal to each other.

In the case where a negative (−) offset occurs in the reference voltage VREF, operations opposite to the above-described operations are performed. Namely, compared to the case where the level of the reference voltage VREF is the alpha level, if the level of the reference voltage VREF is a gamma level (gamma level<alpha level), the pull-up driving force of the driver 200 is increased and the pull-down driving force of the driver 200 is decreased. As a result, even though the high pulse width of the output signal PRE_OUT of the amplification unit 100 becomes longer than the low pulse width of the output signal PRE_OUT of the amplification unit 100 due to the negative (−) offset in the reference voltage VREF, the pull-up driving force of the driver 200 is increased and the pull-down driving force of the driver 200 is decreased in correspondence to the negative (−) offset of the reference voltage VREF, so that the high pulse width and the low pulse width of the signal OUT loaded on the output node are controlled to become equal to each other.

Figure 6:
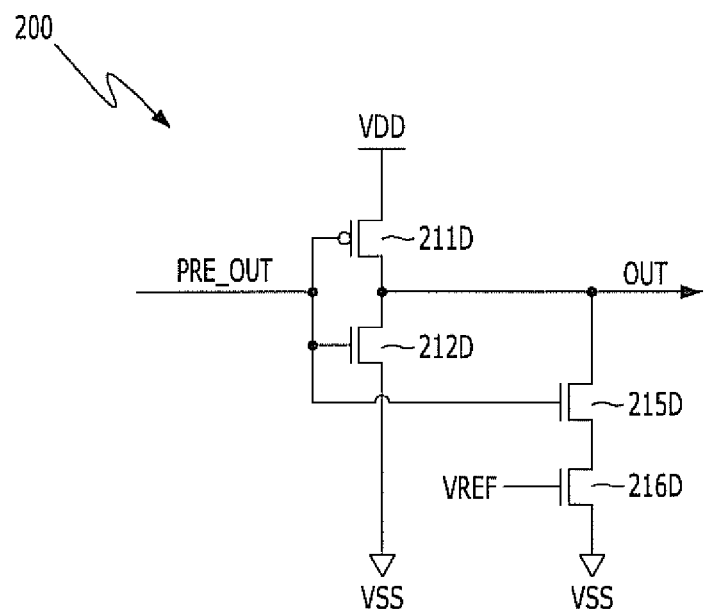
FIG. 6 is a diagram showing a driver in accordance with a fourth embodiment of the present invention.

FIG. 6 is a diagram showing a driver 200 in accordance with a fourth embodiment of the present invention.

Referring to FIG. 6, the driver 200 may include a first transistor 211D, a second transistor 212D, a fifth transistor 215D, and a sixth transistor 216D. The driver 200 shown in FIG. 6 is similar to the driver 200 shown in FIG. 3 in that a pull-down driving force is controlled according to a level variation of the reference voltage VREF with exception to some structural differences. Hereinbelow, descriptions will be mainly concentrated on differences between the driver 200 shown in FIG. 6 and the driver 200 shown in FIG. 3.

The first transistor 211D pull-up drives an output node in response to the output signal PRE_OUT of the amplification unit 100. In detail, the first transistor 211D may be a PMOS transistor having a gate terminal to which the output signal PRE_OUT of the amplification unit 100 is applied, a drain terminal connected with the output node and a source terminal connected with a high level voltage, for example, a power supply voltage VDD.

The second transistor 212D pull-down drives the output node in response to the output signal PRE_OUT of the amplification unit 100. In detail, the second transistor 212D may be an NMOS transistor having a gate terminal to which the output signal PRE_OUT of the amplification unit 100 is applied, a drain terminal connected with the output node and a source terminal connected with a low level voltage, for example, a ground voltage VSS.

The fifth transistor 215D pull-down drives the output node in response to the output signal PRE_OUT of the amplification unit 100. In detail, the fifth transistor 215D may be an NMOS transistor having a gate terminal to which the output signal PRE_OUT of the amplification unit 100 is applied, a drain terminal connected with the output node and a source terminal connected with the drain terminal of the sixth transistor 216D.

The sixth transistor 216D controls the pull-down driving force of the driver 200 in response to the reference voltage VREF. In detail, the sixth transistor 216D may be an NMOS transistor having a gate terminal to which the reference voltage VREF is applied, the drain terminal connected with the source terminal of the fifth transistor 215D and a source terminal connected with a low level voltage, for example, the ground voltage VSS.

Operations of the driver 200 shown in FIG. 6 will be described below. If the output signal PRE_OUT of the amplification unit 100 is a high level, the first transistor 211D is turned off and the second and fifth transistors 212D and 215D are turned on such that an output node is pull-down driven. Conversely, if the output signal PRE_OUT of the amplification unit 100 is a low level, the first transistor 211D is turned on and the second and fifth transistors 212D and 215D are turned off such that the output node is pull-up driven.

If a positive (+) offset occurs in the reference voltage VREF, that is, if the level of the reference voltage VREF is changed from an alpha level to a beta level (alpha level<beta level), the turn-on degree of the sixth transistor 216D increases compared to when the reference voltage VREF has the alpha level. Thus, an amount of current flowing from the output node to the source terminal of the sixth transistor 216D increases compared to when the reference voltage VREF has the alpha level. In other words, if the level of the reference voltage VREF applied to the gate terminal of the sixth transistor 216D is changed from the alpha level to the beta level, the pull-down driving force of the driver 200 is increased compared to when the reference voltage VREF of the alpha level is applied to the gate terminal of the sixth transistor 216D. As a consequence, compared to the case where the reference voltage VREF has the alpha level, if the reference voltage VREF has the beta level, the high pulse width of a signal OUT loaded on the output node tends to shorten, and the low pulse width of the signal OUT loaded on the output node tends to lengthen. In detail, in the case where the reference voltage VREF of the alpha level is applied to the gate terminal of the sixth transistor 216D, the output node is pull-up driven when the level of the output signal PRE_OUT of the amplification unit 100 is lower than a delta level and is pull-down driven when the level of the output signal PRE_OUT of the amplification unit 100 is higher than the delta level. However, in the case where the reference voltage VREF of the beta level is applied to the gate terminal of the sixth transistor 216D, the output node is pull-up driven when the level of the output signal PRE_OUT of the amplification unit 100 is lower than a zeta level (zeta level<delta level) and is pull-down driven when the level of the output signal PRE_OUT of the amplification unit 100 is higher than the zeta level. As a result, compared to when the reference voltage VREF of the alpha level is applied to the gate terminal of the sixth transistor 216D, if the reference voltage VREF of the beta level is applied to the gate terminal of the sixth transistor 216D, the high pulse width of the signal OUT loaded on the output node tends to shorten, and the low pulse width of the signal OUT loaded on the output node tends to lengthen. Namely, even though the high pulse width of the output signal PRE_OUT of the amplification unit 100 becomes shorter than the low pulse width of the output signal PRE_OUT of the amplification unit 100 due to the positive (+) offset in the reference voltage VREF, the pull-down driving force of the driver 200 tends to increase in correspondence to the positive (+) offset of the reference voltage VREF, so that the high pulse width and the low pulse width of the signal OUT loaded on the output node become equal to each other.

In the case where a negative (−) offset occurs in the reference voltage VREF, operations opposite to the above-described operations are performed. That is to say, compared to when the level of the reference voltage VREF is the alpha level, if the level of the reference voltage VREF is a gamma level (gamma level<alpha level), the pull-down driving force of the driver 200 decreases. As a result, even though the high pulse width of the output signal PRE_OUT of the amplification unit 100 becomes longer than the low pulse width of the output signal PRE_OUT of the amplification unit 100 due to the negative (−) offset in the reference voltage VREF, the pull-down driving force of the driver 200 is decreased in correspondence to the negative (−) offset of the reference voltage VREF, so that the high pulse width and the low pulse width of the signal OUT loaded on the output node are controlled to become equal to each other.

Meanwhile, the change amount of the pull-down driving force of the driver 200 may be controlled depending upon the size of the sixth transistor 216D. For example, if the sixth transistor 216D is changed from a small size to a large size, an increased amount of current may pass through the sixth transistor 216D when the sixth transistor 216D is turned on, by which the pull-down driving force of the driver 200 may be increased to a larger extent. Conversely, if the sixth transistor 216D is changed from a large size to a small size, a decreased amount of current may pass through the sixth transistor 216D when the sixth transistor 216D is turned on, by which the pull-down driving force of the driver 200 may be increased to a smaller extent.

Figure 7:
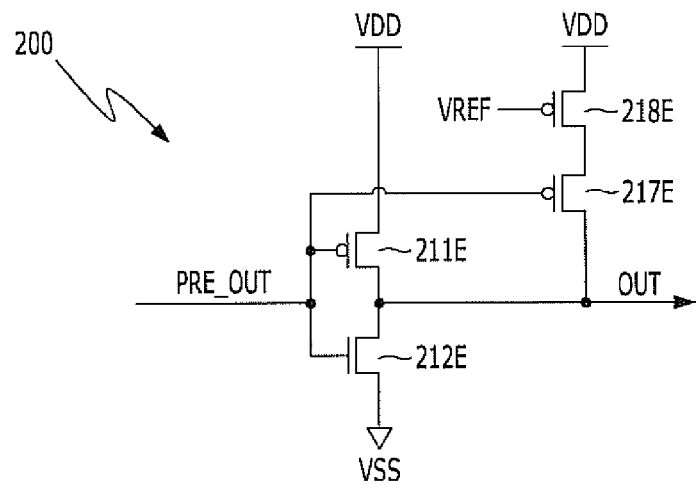
FIG. 7 is a diagram showing a driver in accordance with a fifth embodiment of the present invention.

FIG. 7 is a diagram showing a driver 200 in accordance with a fifth embodiment of the present invention.

Referring to FIG. 7, the driver 200 may include a first transistor 211E, a second transistor 212E, a seventh transistor 217E, and an eighth transistor 218E. The driver 200 shown in FIG. 7 is distinguished from the driver 200 shown in FIG. 6 in that a pull-up driving force is controlled in response to the reference voltage VREF. Hereinbelow, descriptions will be mainly concentrated on differences between the driver 200 shown in FIG. 7 and the driver 200 shown in FIG. 6.

The first transistor 211E and the second transistor 212E shown in FIG. 7 have the same configurations and operating principles as the first transistor 211D and the second transistor 212D shown in FIG. 6.

The seventh transistor 217E pull-up drives an output node in response to the output signal PRE_OUT of the amplification unit 100. In detail, the seventh transistor 217E may be a PMOS transistor having a gate terminal to which the output signal PRE_OUT of the amplification unit 100 is applied, a source terminal connected with the drain terminal of the eighth transistor 218E and a drain terminal connected with the output node.

The eighth transistor 218E controls the pull-up driving force of the driver 200 in response to the reference voltage VREF. In detail, the eighth transistor 218E may be a PMOS transistor having a gate terminal to which the reference voltage VREF is applied, a source terminal connected with a high level voltage, for example, a power supply voltage VDD, and the drain terminal connected with the source terminal of the seventh transistor 217E.

Operations of the driver 200 shown in FIG. 7 will be described below. If the output signal PRE_OUT of the amplification unit 100 has a high level, the first transistor 211E and the seventh transistor 217E are turned off, and the second transistor 212E is turned on, by which the output node is pull-down driven. Conversely, if the output signal PRE_OUT of the amplification unit 100 has a low level, the first transistor 211E and the seventh transistor 217E are turned on, and the second transistor 212E is turned off, by which the output node is pull-up driven.

If a positive (+) offset occurs in the reference voltage VREF, that is, if the level of the reference voltage VREF is changed from an alpha level to a beta level (alpha level<beta level), the turn-on degree of the eighth transistor 218E decreases compared to when the reference voltage VREF of the alpha level is applied to the gate terminal of the eighth transistor 218E. Thus, an amount of current flowing through the eighth transistor 218E to the output node decreases compared to when the reference voltage VREF of the alpha level is applied to the gate terminal of the eighth transistor 218E. In other words, the pull-up driving force of the driver 200 decreases compared to when the reference voltage VREF of the alpha level is applied to the gate terminal of the eighth transistor 218E. As a consequence, compared to the case where the reference voltage VREF applied to the gate terminal of the eighth transistor 218E has the alpha level, if the reference voltage VREF has the beta level, the high pulse width of a signal OUT loaded on the output node tends to shorten, and the low pulse width of the signal OUT loaded on the output node tends to lengthen. In detail, in the case where the reference voltage VREF of the alpha level is applied to the gate terminal of the eighth transistor 218E, the output node is pull-up driven when the level of the output signal PRE_OUT of the amplification unit 100 is lower than a delta level and is pull-down driven when the level of the output signal PRE_OUT of the amplification unit 100 is higher than the delta level. However, in the case where the reference voltage VREF of the beta level is applied to the gate terminal of the eighth transistor 218E, the output node is pull-up driven when the level of the output signal PRE_OUT of the amplification unit 100 is lower than a zeta level (zeta level<delta level) and is pull-down driven when the level of the output signal PRE_OUT of the amplification unit 100 is higher than the zeta level. As a result, compared to when the reference voltage VREF of the alpha level is applied to the gate terminal of the eighth transistor 218E, if the reference voltage VREF of the beta level is applied to the gate terminal of the eighth transistor 218E, the high pulse width of the signal OUT loaded on the output node tends to shorten, and the low pulse width of the signal OUT loaded on the output node tends to lengthen. Namely, even though the high pulse width of the output signal PRE_OUT of the amplification unit 100 becomes shorter than the low pulse width of the output signal PRE_OUT of the amplification unit 100 due to the positive (+) offset in the reference voltage VREF, the pull-up driving force of the driver 200 is decreased in correspondence to the positive (+) offset of the reference voltage VREF, so that the high pulse width and the low pulse width of the signal OUT loaded on the output node become equal to each other.

In the case where a negative (−) offset occurs in the reference voltage VREF, operations opposite to the above-described operations are performed. That is to say, compared to when the level of the reference voltage VREF is the alpha level, if the level of the reference voltage VREF is a gamma level (gamma level<alpha level), the pull-up driving force of the driver 200 is increased. As a result, even though the high pulse width of the output signal PRE_OUT of the amplification unit 100 becomes longer than the low pulse width of the output signal PRE_OUT of the amplification unit 100 due to the negative (−) offset in the reference voltage VREF, the pull-up driving force of the driver 200 is increased in correspondence to the negative (−) offset of the reference voltage VREF, so that the high pulse width and the low pulse width of the signal OUT loaded on the output node are controlled to become equal to each other.

Meanwhile, the change amount of the pull-down driving force of the driver 200 may be controlled depending upon the size of the eighth transistor 218E. For example, if the eighth transistor 218E is changed from a small size to a large size, an increased amount of current may pass through the eighth transistor 218E when the eighth transistor 218E is turned on, by which the pull-up driving force of the driver 200 may be increased to a larger extent. Conversely, if the eighth transistor 218E is changed from a large size to a small size, a decreased amount of current may pass through the eighth transistor 218E when the eighth transistor 218E is turned on, by which the pull-up driving force of the driver 200 may be increased to a smaller extent.

Figure 8:
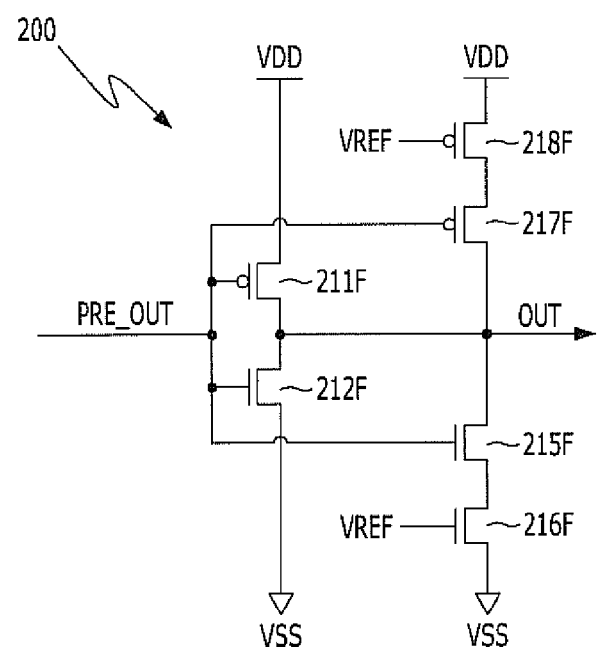
FIG. 8 is a diagram showing a driver in accordance with a sixth embodiment of the present invention.

FIG. 8 is a diagram showing a driver 200 in accordance with a sixth embodiment of the present invention.

Referring to FIG. 8, the driver 200 may include a first transistor 211F, a second transistor 212F, a fifth transistor 215F, a sixth transistor 216F, a seventh transistor 217F, and an eighth transistor 218F.

The driver 200 shown in FIG. 8 is distinguished from the driver 200 shown in FIG. 6 or FIG. 7 in that a pull-up driving force and a pull-down driving force are simultaneously controlled in response to the reference voltage VREF. That is to say, in the driver 200, the pull-up driving force decreases and the pull-down driving force increases when the level of the reference voltage VREF rises, and the pull-up driving force increases and the pull-down driving force decreases when the level of the reference voltage VREF falls. Hereinbelow, descriptions will be mainly concentrated on differences between the driver 200 shown in FIG. 8 and the driver 200 shown in FIG. 6 or FIG. 7.

The first transistor 211F, the second transistor 212F, the fifth transistor 215F and the sixth transistor 216F shown in FIG. 8 have the same configurations and operating principles as the first transistor 211D, the second transistor 212D, the fifth transistor 215D and the sixth transistor 216D shown in FIG. 6. Also, the seventh transistor 217F and the eighth transistor 218F shown in FIG. 8 have the same configurations and operating principles as the seventh transistor 217F and the eighth transistor 218F shown in FIG. 7.

Operations of the driver 200 shown in FIG. 8 will be described below. If a positive (+) offset occurs in the reference voltage VREF, that is, if the reference voltage VREF is changed from an alpha level to a beta level (alpha level<beta level), the turn-on degree of the sixth transistor 216F increases compared to when the reference voltage VREF of the alpha level is applied to the gate terminal of the sixth transistor 216F. In other words, the pull-down driving force of the driver 200 is increased. Further, the turn-on degree of the eighth transistor 218F decreases compared to when the reference voltage VREF of the alpha level is applied to the gate terminal of the eighth transistor 218F. In other words, the pull-up driving force of the driver 200 decreases. As a consequence, compared to when the reference voltage VREF has the alpha level, if the reference voltage VREF has the beta level, the high pulse width of a signal OUT loaded on an output node tends to shorten and the low pulse width of the signal OUT loaded on the output node tends to lengthen. Here, even though the high pulse width of the output signal PRE_OUT of the amplification unit 100 becomes shorter than the low pulse width of the output signal PRE_OUT of the amplification unit 100 due to the positive (+) offset in the reference voltage VREF, the pull-up driving force of the driver 200 is decreased and the pull-down driving force of the driver 200 is increased in correspondence to the positive (+) offset of the reference voltage VREF, so that the high pulse width and the low pulse width of the signal OUT loaded on the output node are controlled to become equal to each other.

In the case where a negative (−) offset occurs in the reference voltage VREF, operations opposite to the above-described operations are performed. That is to say, compared to when the level of the reference voltage VREF is the alpha level, if the level of the reference voltage VREF is a gamma level (gamma level<alpha level), the pull-up driving force of the driver 200 is increased and the pull-down driving force of the driver 200 is decreased. As a result, even though the high pulse width of the output signal PRE_OUT of the amplification unit 100 becomes longer than the low pulse width of the output signal PRE_OUT of the amplification unit 100 due to the negative (−) offset in the reference voltage VREF, the pull-up driving force of the driver 200 is increased and the pull-down driving force of the driver 200 is decreased in correspondence to the negative (−) offset of the reference voltage VREF, so that the high pulse width and the low pulse width of the signal OUT loaded on the output node are controlled to become equal to each other.

While it was described so far that the reference voltage VREF is directly used for controlling the driving forces of the driver 200, since the driving forces of the driver 200 are controlled in correspondence to offsets of the reference voltage VREF in the embodiment of the present invention, a signal which is not the reference voltage VREF may be used for controlling the driving forces of the driver 200 so long as the level of the signal may be changed in correspondence to the reference voltage VREF.

Figure 9:
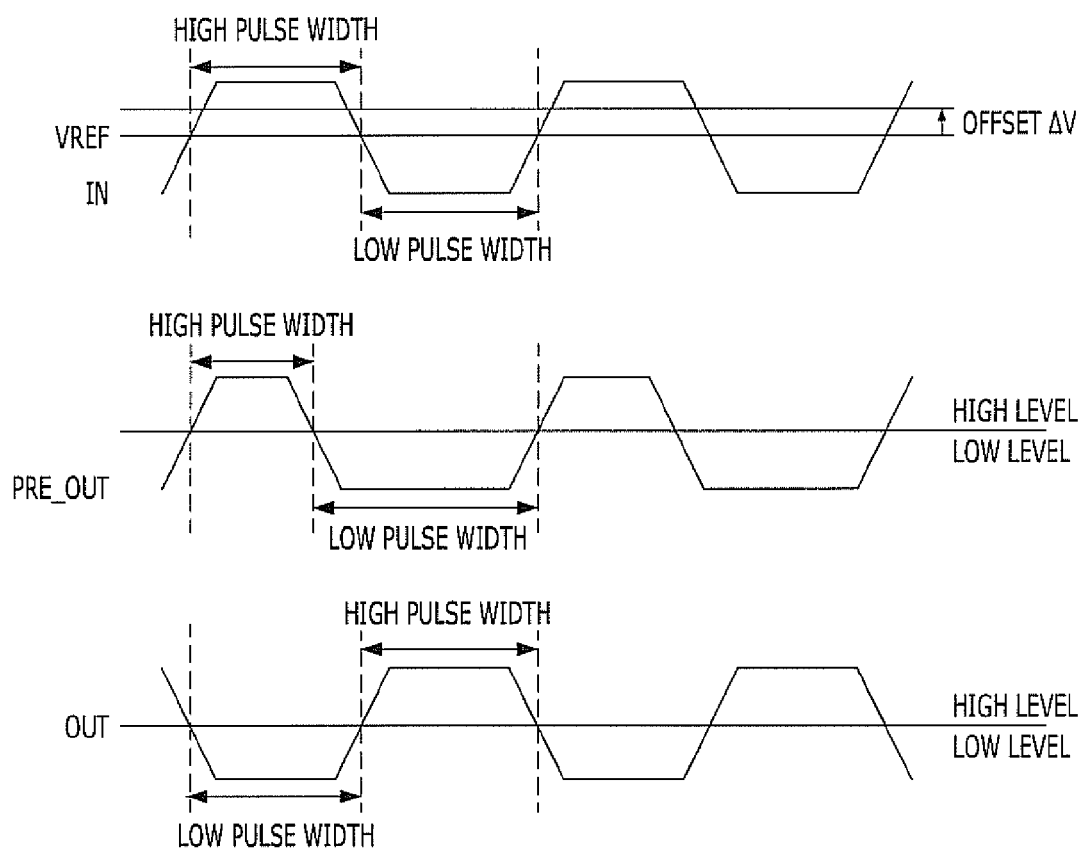
FIG. 9 is a waveform diagram of the buffer circuit shown in FIG. 3.

FIG. 9 is a waveform diagram of the buffer circuit shown in FIG. 3.

For illustration purposes, FIG. 9 shows a case where a positive (+) offset occurs in the reference voltage VREF. If the positive (+) offset occurs in the reference voltage VREF, the high pulse width of the output signal PRE_OUT of the amplification unit 100 is shortened and the low pulse width of the output signal PRE_OUT of the amplification unit 100 is shortened. That is to say, the duty of the output signal PRE_OUT becomes unbalanced. As the output signal PRE_OUT of the amplification unit 100 is outputted by being inverted, the high pulse width of a signal OUT loaded on an output node becomes longer than the low pulse width of the signal OUT loaded on the output node in the conventional driver 20. Namely, the duty of the signal OUT loaded on the output node becomes unbalanced. However, in the embodiment of the present invention, because the pull-down driving force of a driver 200 is increased in correspondence to the positive (+) offset of the reference voltage VREF, the high pulse width and the low pulse width of a signal OUT loaded on an output node become equal to each other.

As is apparent from the above description, according to the embodiment of the present invention, since the duty of a signal is controlled using a reference voltage, the area of a chip may be reduced and the integrity of a signal may be adequately obtained.

While the present invention has been described with respect to the specific embodiments, it will be apparent to those skilled in the art that various changes and modifications may be made without departing from the spirit and scope of the invention as defined in the following claims.

What is claimed is:

1. A buffer circuit comprising:
    an amplification unit configured to amplify a difference between an input signal and a reference voltage and output the amplified difference as an output of the amplification unit; and
    a driver configured to drive an output node in response to the output of the amplification unit and be controlled in at least one of a pull-up driving strength and a pull-down driving strength at the output node in response to the reference voltage,
    wherein the amplification unit and the driver are configured so that as the reference voltage becomes higher, a high pulse width of the output of the amplification unit tends to become shorter, a period of pull-down driving by the driver tends to become shorter, and the pull-down driving strength of the driver tends to become stronger so as to offset effects at the output node of the shorter period of pull-down driving by the driver.

2. The buffer circuit of claim 1, wherein the pull-down driving strength of the driver is configured to increase if a level of the reference voltage rises and decrease if the level of the reference voltage falls.

3. The buffer circuit of claim 1, wherein the pull-up driving strength of the driver is configured to decrease if a level of the reference voltage rises and increase if the level of the reference voltage falls.

4. The buffer circuit of claim 1, wherein the pull-up driving strength and the pull-down driving strength of the driver are configured to decrease and increase, respectively when a level of the reference voltage rises and increase and decrease, respectively, when the level of the reference voltage falls.

5. The buffer circuit of claim 1, wherein the driver comprises:
    a first transistor having a gate terminal coupled to receive the output signal of the amplification unit and a source terminal coupled to receive a voltage of a first level;
    a second transistor having a gate terminal coupled to receive the output signal of the amplification unit and a drain terminal coupled to receive a drain terminal of the first transistor; and
    a third transistor having a gate terminal coupled to receive the reference voltage, a source terminal coupled to receive a voltage of a second level, and a drain terminal coupled to a source terminal of the second transistor.

6. The buffer circuit of claim 5, wherein the voltage of the second level is a voltage lower than the voltage of the first level.

7. The buffer circuit of claim 1, wherein the driver comprises:
    a first transistor having a gate terminal coupled to receive the output signal of the amplification unit;
    a second transistor having a gate terminal coupled to receive the output signal of the amplification unit and a drain terminal coupled to a drain terminal of the first transistor;
    a third transistor having a gate terminal coupled to receive the reference voltage, a source terminal coupled to receive a voltage of a second level, and a drain terminal coupled to a source terminal of the second transistor; and
    a fourth transistor having a gate terminal coupled to receive the reference voltage, a source terminal coupled to receive a voltage of a first level, and a drain terminal coupled to a source terminal of the first transistor.

8. The buffer circuit of claim 1, wherein the driver comprises:
    a first transistor having a gate terminal coupled to receive the output signal of the amplification unit, a source terminal coupled to receive a voltage of a first level, and a drain terminal coupled to the output node;
    a second transistor having a gate terminal coupled to receive the output signal of the amplification unit, a source terminal coupled to receive a voltage of a second level, and a drain terminal coupled to the output node;
    a third transistor having a gate terminal coupled to receive the output signal of the amplification unit and a drain terminal coupled to the output node; and
    a fourth transistor having a gate terminal coupled to receive the reference voltage, a drain terminal coupled to a source terminal of the third transistor, and a source terminal coupled to receive the voltage of the second level.

9. The buffer circuit of claim 8, wherein the voltage of the second level is lower than the voltage of the first level.

10. The buffer circuit of claim 8, wherein the driver further comprises:
    a fifth transistor having a gate terminal coupled to receive the output signal of the amplification unit and a drain terminal coupled to receive the output node; and
    a sixth transistor having a gate terminal coupled to receive the reference voltage, a drain terminal coupled to a source terminal of the fifth transistor, and a source terminal coupled to receive the voltage of the first level.

11. The buffer circuit of claim 1, wherein the amplification unit and the driver are configured so that as the reference voltage becomes lower, a high pulse width of the output of the amplification unit tends to become longer, a period of pull-up driving by the driver tends to become shorter, and the pull-up driving strength of the driver tends to become stronger so as to offset effects at the output node of the shorter period of pull-up driving by the driver.

* * * * *